(12) United States Patent
Loewenhardt et al.

(10) Patent No.: US 7,976,673 B2
(45) Date of Patent: Jul. 12, 2011

(54) RF PULSING OF A NARROW GAP CAPACITIVELY COUPLED REACTOR

(75) Inventors: Peter Loewenhardt, Pleasanton, CA (US); Mukund Srinivasan, Fremont, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 847 days.

(21) Appl. No.: 10/431,030

(22) Filed: May 6, 2003

(65) Prior Publication Data

US 2004/0221958 A1 Nov. 11, 2004

(51) Int. Cl.
*H01L 21/00* (2006.01)
*C23F 1/00* (2006.01)

(52) U.S. Cl. .................................. 156/345.47

(58) Field of Classification Search ............... 118/723 E; 156/345.43, 345.44, 345.45, 345.46, 345.47; 315/111.21
See application file for complete search history.

(56) References Cited

U.S. PATENT DOCUMENTS

| | | | | |
|---|---|---|---|---|
| 4,464,226 A | | 8/1984 | Karvinen | 162/358 |
| 4,500,563 A | | 2/1985 | Ellenberger et al. | 427/38 |
| 4,585,516 A | * | 4/1986 | Corn et al. | 438/714 |
| 4,863,549 A | * | 9/1989 | Grunwald | 156/345.44 |
| 4,889,588 A | | 12/1989 | Fior | 156/643 |
| 5,160,397 A | | 11/1992 | Doki et al. | 156/345 |
| 5,310,452 A | | 5/1994 | Doki et al. | 156/643 |
| 5,468,341 A | | 11/1995 | Samukawa | 216/69 |
| 5,534,751 A | * | 7/1996 | Lenz et al. | 315/111.71 |
| 5,565,036 A | * | 10/1996 | Westendorp et al. | 118/723 MP |
| 5,614,060 A | | 3/1997 | Hanawa | 156/643.1 |
| 5,683,538 A | | 11/1997 | O'Neill et al. | 156/345 |
| 5,755,886 A | * | 5/1998 | Wang et al. | 118/715 |
| 5,935,373 A | * | 8/1999 | Koshimizu | 156/345.28 |
| 6,008,130 A | * | 12/1999 | Henderson et al. | 438/710 |
| 6,070,552 A | * | 6/2000 | Mizuno et al. | 118/723 E |
| 6,089,181 A | * | 7/2000 | Suemasa et al. | 118/723 E |
| 6,093,332 A | | 7/2000 | Winniczek et al. | 216/2 |
| 6,110,287 A | * | 8/2000 | Arai et al. | 156/345.34 |

(Continued)

FOREIGN PATENT DOCUMENTS

DE 3733135 C1 9/1988

(Continued)

OTHER PUBLICATIONS

European Patent Office. "RF Modulation Device and Technique for Plasma Processing and Diagnostics", IBM Technical Disclosure Bulletin, Sep. 1985, 3 pages.

(Continued)

*Primary Examiner* — Ram N Kackar
*Assistant Examiner* — Michelle Crowell
(74) *Attorney, Agent, or Firm* — IP Strategy Group, P.C.

(57) ABSTRACT

An apparatus for providing a plasma etch of a layer over a wafer is provided. A capacitively coupled process chamber is provided. A gas source is provided. A first and a second electrode are provided within the process chamber. A first radio frequency power source is electrically connected to at least one of the first and second electrodes, where the first radio frequency power source provides radio frequency power. A second radio frequency power source is electrically connected to at least one of the first and second electrodes. A first modulation control is connected to the first radio frequency power source, to provide a controlled modulation of the first radio frequency power source.

17 Claims, 3 Drawing Sheets

U.S. PATENT DOCUMENTS

| | | | |
|---|---|---|---|
| 6,129,806 A * | 10/2000 | Kaji et al. | 156/345.46 |
| 6,214,162 B1 * | 4/2001 | Koshimizu | 156/345.28 |
| 6,489,245 B1 | 12/2002 | Winniczek et al. | 438/706 |
| 2002/0111041 A1 | 8/2002 | Annapragada et al. | |
| 2002/0114897 A1 | 8/2002 | Sumiya et al. | |

FOREIGN PATENT DOCUMENTS

| | | |
|---|---|---|
| EP | 0140294 A2 | 5/1985 |
| EP | 0734046 A2 | 9/1996 |
| EP | 0734046 | 4/2000 |
| JP | 9-120957 | 5/1997 |
| JP | 11-219938 | 8/1999 |
| JP | 2001110798 A * | 4/2001 |
| JP | 2003-77904 | 3/2003 |
| WO | 97/14177 | 4/1997 |
| WO | WO 03/003405 A1 | 1/2003 |

OTHER PUBLICATIONS

Giffin et al., "Silicon Dioxide Profile Control for Contacts and Vias", Solid State Technology, Apr. 1989, 3 pages.

Maeshige et al., "Functional Design of a Pulsed Two-Frequency Capacitively Coupled Plasma in $CF_4$ Ar for $SiO_2$ Etching", Journal of Applied Physics, vol. 91, No. 12, Jun. 15, 2002, pp. 9494-9501.

International Search Report and Written Opinion, dated May 6, 2005.

Janowiak C. et al., "Etching of Organic Low Dielectric Constant Material SiLK™ on the Lam Research Corporation 4520XLE™", Journal of Vacuum Science and Technology A. Vacuum, Surfaces and Films, American Institute of Physics, New York, NY, US, vol. 18, No. 4, Jul. 2000, pp. 1859-1863.

European Examination Report dated Jun. 12, 2007 for related European Patent Application No. 04751199.3.

Japanese Office Action dated May 11, 2010 from Japanese Application No. 2006-532543.

Chinese Office Action dated Oct. 10, 2008 from related Chinese Patent Application No. 200480019139.5.

Chinese Office Action dated Jul. 24, 2009 from related Chinese Patent Application No. 200480019139.5.

Chinese Office Action dated Apr. 10, 2009 from related Chinese Patent Application No. 200480019139.5.

European Notice of Allowance dated Dec. 10, 2009 from related European Patent Application No. 04 751 199.3.

European Summons to Attend Oral Proceedings dated Oct. 7, 2009 from Related European Patent Application No. 04 751 199.3.

Singapore Written Opinion dated Oct. 4, 2007 from Related Singapore Patent Application No. 200507192-3.

Singapore Examination Report dated Sep. 18, 2008 from Related Singapore Patent Application No. 200507192-3.

Decision of Rejection dated Nov. 2, 2010 from Japanese Application No. 2006-532543.

* cited by examiner

RF PULSING OF A NARROW GAP CAPACITIVELY COUPLED REACTOR

BACKGROUND OF THE INVENTION

1. Field of the Invention

The invention relates to a method and apparatus for providing a structure on a semiconductor wafer by etching a layer over a substrate.

2. Description of the Related Art

In semiconductor plasma etching applications, a plasma etcher is usually used to transfer a mask pattern into a circuit and line pattern of a desired thin film and/or filmstack (conductors or dielectric insulators) on a wafer. This is achieved by etching away the films (and filmstacks) underneath the mask materials in the opened areas of the mask pattern. This etching reaction may be initiated by the chemically active species and electrically charged particles (ions) generated by generating a plasma from a reactant mixture contained in a vacuum enclosure also referred to as a reactor or process chamber. Additionally, the ions may be also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials may be removed by stripping them away, leaving in its place a replica of the lateral pattern of the original intended mask patterns.

It is known to use in inductively coupled plasma device an RF power source that is pulsed or modulated. It is believed that such pulsing allows electron temperature to drop rapidly during the off portion of the pulse, which lowers the average electron temperature. During the RF off period, when the electron temperature drops rapidly, the plasma ion density decreases at a much slower rate, since ions are more massive than electrons and therefore move much slower than electrons. Therefore, this process may significantly lower the average electron temperature, while keeping the average plasma density approximately unchanged. This may reduce electron shading effects, reducing electron damage to semiconductor device features. Such a process may pulse a single RF frequency.

SUMMARY OF THE INVENTION

To achieve the foregoing and in accordance with the purpose of the present invention, an apparatus for providing a plasma etch of a layer over a wafer is provided. A capacitively coupled process chamber is provided. A gas source is in fluid connection with the capacitively coupled process chamber. A first electrode is provided within the process chamber. A second electrode is spaced apart and opposite from the first electrode. A first radio frequency power source is electrically connected to at least one of the first and second electrodes, where the first radio frequency power source provides radio frequency power of between 150 kHz and 10 MHz. A second radio frequency power source is electrically connected to at least one of the first and second electrodes, wherein the second radio frequency power source provides a radio frequency power of between 12 MHz and 200 MHz. A first modulation control is connected to the first radio frequency power source, to provide a controlled modulation of the first radio frequency power source at a frequency of between 1 kHz to 100 kHz.

In another embodiment of the invention, an apparatus for providing a plasma etch of a layer over a wafer is provided. A capacitively coupled process chamber is provided. A gas source is in fluid connection with the capacitively coupled process chamber. A first electrode is provided within the process chamber. A second electrode is spaced apart and opposite from the first electrode, where the second electrode is spaced apart from the first electrode forming a gap, and where the wafer is mountable between the first and second electrodes and wherein an aspect ratio of a wafer diameter to gap size is between 6:1 to 60:1. A first radio frequency power source for providing a power signal at a first frequency is electrically connected to at least one of the first and second electrodes. A second radio frequency power source for providing a power signal at a second frequency is electrically connected to at least one of the first and second electrodes, where the first frequency is different than the second frequency. A first modulation control is connected to the first radio frequency power source, to provide a controlled modulation of the first radio frequency power source at a frequency of between 1 kHz to 100 kHz. A second modulation control is connected to the second radio frequency power source, to provide a controlled modulation of the second radio frequency power source at a frequency of between about 1 kHz to about 100 kHz.

In another embodiment of the invention, a method for etching a layer over a wafer is provided. The wafer is placed in a capacitively coupled process chamber. An etching gas is provided into the process chamber. A capacitively coupled first radio frequency signal is provided into the process chamber. The first radio frequency signal is modulated. A capacitively coupled second radio frequency signal is provided into the process chamber. The second radio frequency signal is modulated.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During an etching process, etchant mixture gases dissociate into various species. For example, using an etch chemistry of $C_4F_8$ and $O_2$, the $C_4F_8$ may dissociate to ions of $CF_2^+$ and $F^+$ in an etch plasma. $F^+$ may tend to etch the photoresist. Therefore to increase etch selectivity, it may be desirable to dissociate $C_4F_8$ to yield more $CF_2^+$ and less $F^+$. Therefore, it would be desirable to be able to control the ratio of resulting species generated in a plasma.

Figure 1:
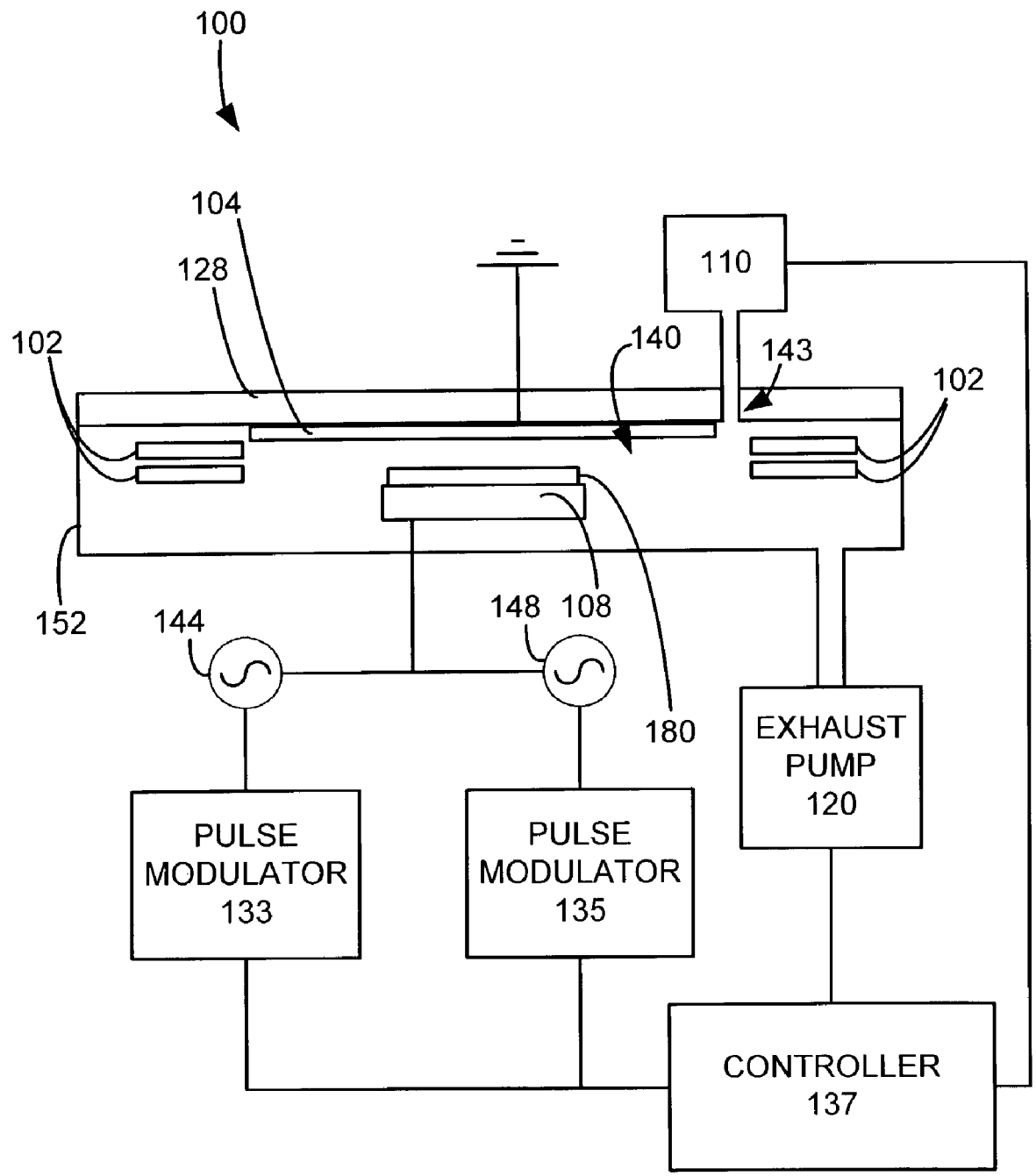
FIG. 1 is a schematic view of a capacitively coupled process chamber that may be used in the preferred embodiment of the invention.

FIG. 1 is a schematic view of a capacitively coupled process chamber 100 that may be used in the preferred embodiment of the invention. In this embodiment, the plasma processing chamber 100 comprises confinement rings 102, an upper electrode 104, a lower electrode 108, a gas source 110, and an exhaust pump 120. Within plasma processing chamber 100, the substrate wafer 180 is positioned upon the lower electrode 108. The lower electrode 108 incorporates a suitable substrate chucking mechanism (e.g., electrostatic, mechanical clamping, or the like) for holding the substrate wafer 180. A process chamber top 128 incorporates the upper electrode 104 disposed immediately opposite the lower electrode 108. The upper electrode 104, lower electrode 108, and confinement rings 102 define the confined plasma volume 140. Gas is supplied to the confined plasma volume by gas source 110 through a gas inlet 143 and is exhausted from the confined plasma volume through the confinement rings 102 and an exhaust port by the exhaust pump 120. The exhaust pump 120 forms a gas outlet for the plasma processing chamber.

A first RF source 144 and a second RF source 148 are electrically connected to the lower electrode 108. The first RF source 144 provides a radio frequency power with a frequency between 150 kHz to 10 MHz. Preferably, this frequency is about 2 MHz. The second RF source 148 provides a radio frequency power with a frequency between 12 MHz and 200 MHz. Preferably, this frequency is about 27 MHz. Preferably, the frequency from the second RF source 148 is at least ten times the frequency from the first RF source 144. A first pulse modulator 133 is controllable connected to the first RF source 144. The first pulse modulator 133 is able to modulate the first RF source signal at frequencies between 1 kHz to 100 kHz. A second pulse modulator 135 is controllably connected to the second RF source 148. The second pulse modulator 135 is able to modulate the second RF source signal at frequencies between 1 kHz to 100 kHz. In this embodiment, the upper electrode 104 is grounded. A controller 137 may be controllably connected to the first pulse modulator 133, the second pulse modulator 135, the exhaust pump 120, and the gas source 110. The controller 137 may also be controllably connected with other devices, such as the first and second RF sources 144, 148. Chamber walls 152 define a plasma enclosure in which the confinement rings 102, the upper electrode 104, and the lower electrode 108 are disposed.

In a preferred embodiment, for processing a 300 mm wafer, the gap between the upper and lower electrodes 104, 108 is about 2 cm. Therefore, in this embodiment the aspect ratio between the diameter of the wafer 180 to be processed, which is about the diameter of the lower electrode 108, to the distance between the upper electrode and the lower electrode is 300 mm:2 cm, which is, 15:1. Preferably, the aspect ratio between the diameter of the wafer to be processed and the electrode gap is between 6:1 to 60:1. More preferably, the aspect ratio is between 10:1 to 40:1. As a result, this process chamber has an extremely narrow gap between electrodes. Such aspect ratios use gaps that allow a sheath to be a substantial fraction of the bulk plasma. Preferably, the gap between the upper electrode and lower electrode is less than 8 cm. More preferably, the gap between the upper electrode and the lower electrode is between about 0.5 and 4 cm. Most preferably, the gap between the upper electrode and lower electrode is about 2 cm.

Figure 2:
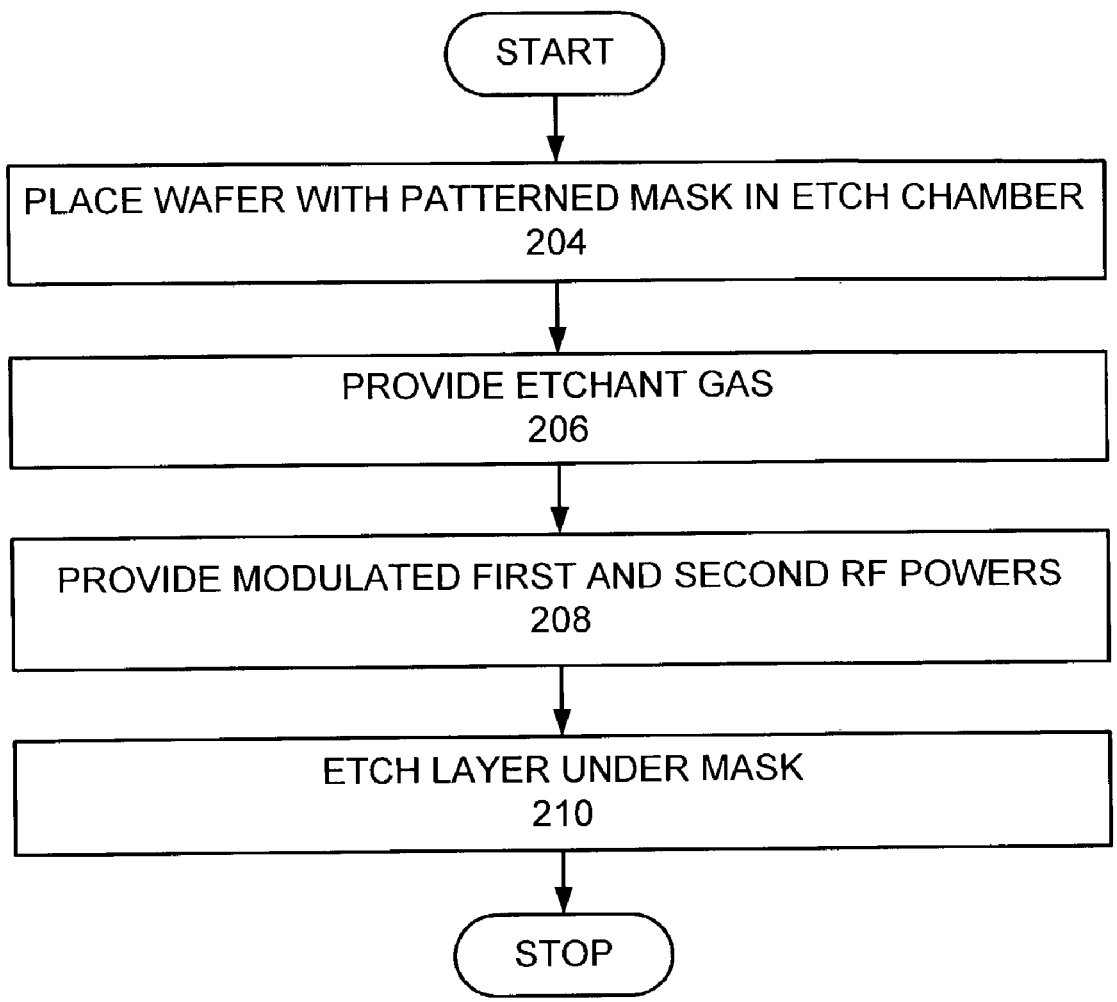
FIG. 2 is a flow chart of a process that may use a preferred embodiment of the invention.

FIG. 2 is a flow chart of a process that may use a preferred embodiment of the invention. In operation, a wafer 180 with a patterned mask is placed in the process chamber 100 (step 204). In this embodiment, the wafer 180 is supported by the lower electrode 108. An etchant gas mixture is provided by the gas source 110 into the plasma volume 140 (step 206). In this example, for etching a dielectric layer over the wafer and under a photoresist mask an etchant gas chemistry of Argon, $C_4F_8$, oxygen, and other component gases may be used. Modulated first and second RF powers are then provided (step 208) to create and sustain a plasma formed from the etchant gas. The plasma is used to etch the layer under the mask (step 210).

Without wishing to be bound by theory, it is believed that modulation of the RF power in a capacitively coupled process chamber causes a change in the sheath of the plasma. Such a change in some systems may only affect a small portion of the plasma volume. The inventive process chamber has a thin plasma volume, defined by a thin electrode gap and high aspect ratio, so that the sheath that is affected by the modulation forms a significant part of the plasma volume. As a result, the modulation may be used to independently control species dissociation and loss to generation ratios for a significant part of the plasma volume.

Figure 3:
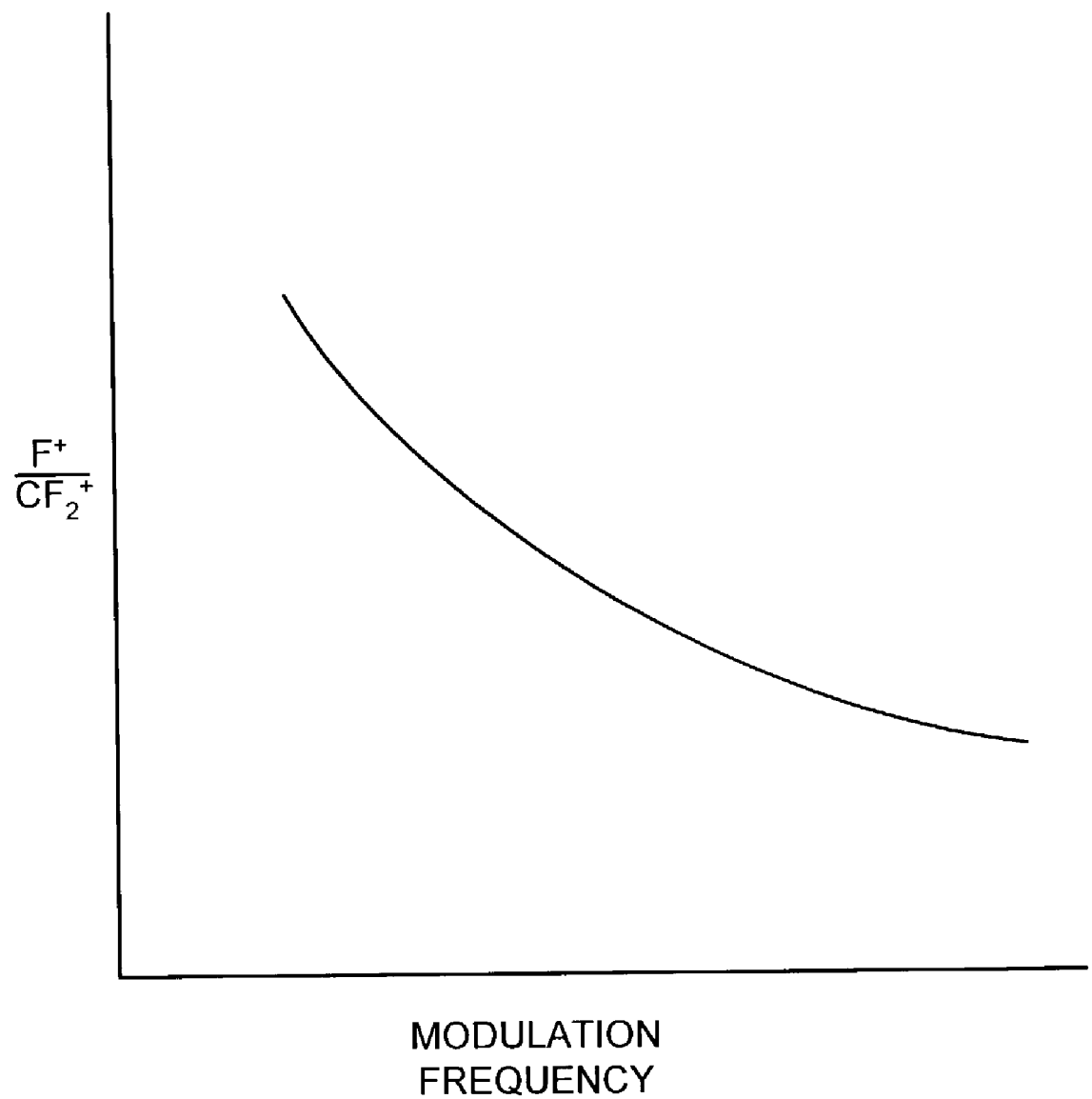
FIG. 3 is a graph of concentration ratios of $F^+$ over $CF_2^+$ versus modulation frequency.

FIG. 3 is a graph of concentration ratios of $F^+$ over $CF_2^+$ versus modulation frequency of the higher frequency RF source. The graph schematically shows that as the modulation frequency increases the ratio of $F^+$ to $CF_2^+$ decreases and that modulation frequency may be used to control the ratio. This is an example of how the invention may be used to control the dissociation ratios of gases in a significant portion of the plasma volume.

The plasma loss to generation ratio is dependent on various factors, such as the number of ions and electrons and their energies. Modulation may be used to change these various factors. As discussed above, such modulation may mainly affect the sheath region. Since the invention provides a sheath region that is a significant part of the volume, the modulation may be used to affect a significant volume of the plasma.

As the volume of the plasma bulk is changed a significant amount, the generation-loss balance in the plasma is altered. A change in balance is known to alter plasma parameters such as electron temperature (and thereby the plasma species fragmentation/dissociation).

The invention also provides an added control that may be used to tailor an etch according to the type of etch. For example, in etching a high aspect ratio contact, a lot of sheath is desired, to provide higher energy ions for etching. The pulse modulators would have a modulation frequency favoring a high sheath potential, even allowing for increased instantaneous lower frequency power during the pulse-on than would be achievable during continuous-wave operation. If instead a trench is to be etched in a low-k dielectric, ion bombardment should be reduced and therefore the sheath should be reduced. This may be accomplished by modulating the lower frequency that typically controls the wafer sheath, allowing further fine tuning of low ion energies.

Modulation may also used to change the percentage of the volume affected by the sheath. Therefore, the invention is able to provide an extra control, for controlling etch bias, sheath, and dissociation chemistry. The controller is able to cause the modulation of the RF power sources to be synchronized or to be modulated independently of each other.

In other embodiments, other RF power source and electrode arrangements may be used. For example, another embodiment may connect the first and second RF sources to the upper electrode.

Other etching benefits may be found from the inventive apparatus that has a narrow plasma volume and allows the modulation of dual RF sources.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. An apparatus for providing a plasma etch of a layer over a wafer, comprising:
   a capacitively coupled process chamber;
   a gas source is in fluid connection with the capacitively coupled process chamber;
   a first electrode within the process chamber;
   a second electrode spaced apart and opposite from the first electrode, wherein the second electrode is spaced from the first electrode so that the space between the first electrode and the second electrode has a ratio to the diameter of the wafer of less than 1:30 and more than or equal to 1:60;
   a first radio frequency power source, electrically connected to the second electrode, wherein the first radio frequency power source provides radio frequency power of between 150 kHz and 10 MHz;
   a second radio frequency power source, electrically connected to the second electrode, wherein the second radio frequency power source provides a radio frequency power of between 12 MHz and 200 MHz;
   a first modulation control connected to the first radio frequency power source, to provide a controlled modulation of the first radio frequency power source at a frequency of between 1 kHz to 100 kHz; and
   a second modulation control connected to the second radio frequency power source, to provide a controlled modulation of the second radio frequency power source at a frequency of between about 1 kHz to about 100 kHz, wherein the second electrode forms a substrate holder or supporting a wafer and wherein the first radio frequency power source and the second radio frequency power source are electrically connected to the second electrode, wherein first modulation control and the second modulation control provide frequency modulation to the second electrode.

2. The apparatus, as recited in claim 1, wherein the second electrode is spaced apart from the first electrode by between about 0.5 and 4 cm.

3. The apparatus, as recited in claim 1, further comprising at least one confinement ring within the process chamber, wherein the at least one confinement ring defines a plasma volume.

4. The apparatus, as recited in claim 1, further comprising a controller controllably connected to the first modulation control and the second modulation control.

5. The apparatus, as recited in claim 1, wherein the second radio frequency is greater than ten times the first radio frequency.

6. An apparatus for providing a plasma etch of a layer over a wafer, comprising:
   a capacitively coupled process chamber;
   a gas source is in fluid connection with the capacitively coupled process chamber;
   a first electrode within the process chamber;
   a second electrode spaced apart and opposite from the first electrode, wherein the second electrode is spaced apart from the first electrode forming a gap, and wherein the wafer is mountable between the first and second electrodes and wherein an aspect ratio of a wafer diameter to gap size is less than 30:1 and more than or equal to 60:1;
   a first radio frequency power source for providing a power signal at a first frequency, electrically connected to the second electrode;
   a second radio frequency power source for providing a power signal at a second frequency, electrically connected to the second electrode, wherein the first frequency is different than the second frequency;
   a first modulation control connected to the first radio frequency power source, to provide a controlled modulation of the first radio frequency power source at a frequency of between 1 kHz to 100 kHz; and
   a second modulation control connected to the second radio frequency power source, to provide a controlled modulation of the second radio frequency power source at a frequency of between about 1 kHz to about 100 kHz.

7. The apparatus, as recited in claim 6, wherein the second electrode is spaced apart from the first electrode by between about 0.5 and 4 cm.

8. The apparatus, as recited in claim 7, wherein the second radio frequency is greater than ten times the first radio frequency.

9. The apparatus, as recited in claim 6, further comprising at least one confinement ring within the process chamber, wherein the at least one confinement ring defines a plasma volume.

10. The apparatus, as recited in claim 6, further comprising a controller controllably connected to the first modulation control and the second modulation control.

11. The apparatus, as recited in claim 6, wherein the second electrode forms a substrate holder for supporting a wafer and wherein the first radio frequency power source and the second radio frequency power source are electrically connected to the second electrode, wherein the first modulation control and the second modulation control provide frequency modulation to the second electrode.

12. The apparatus, as recited in claim 11, wherein the first electrode is grounded.

13. The apparatus, as recited in claim 1, wherein the first electrode is grounded.

14. The apparatus of claim 1, wherein the controlled modulations of the first and second radio frequency power source are designed to cause an increase in a plasma sheath size such that the plasma sheath takes up a significant portion of the gap between the first electrode and the second electrode.

15. The apparatus of claim 6, wherein the controlled modulations of the first and second radio frequency power source are designed to cause an increase in a plasma sheath size such that the plasma sheath takes up a significant portion of the gap between the first electrode and the second electrode.

16. The apparatus, as recited in claim 1, wherein the second radio frequency power source provides a radio frequency between about 27 MHz to 200 MHz.

17. The apparatus, as recited in claim 1, wherein the second radio frequency power source provides a radio frequency of about 27 MHz.

* * * * *